United States Patent
Nakamura

(10) Patent No.: US 7,336,508 B2
(45) Date of Patent: Feb. 26, 2008

(54) SWITCHING POWER SOURCE APPARATUS WITH VOLTAGE GATE DETECTOR FOR THE SWITCH

(75) Inventor: Masaru Nakamura, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 0 days.

(21) Appl. No.: 11/528,542

(22) Filed: Sep. 28, 2006

(65) Prior Publication Data

US 2007/0076449 A1    Apr. 5, 2007

(30) Foreign Application Priority Data

Sep. 30, 2005   (JP) .............................. 2005-288317

(51) Int. Cl.
*H02M 3/335*   (2006.01)
*H02H 7/122*   (2006.01)

(52) U.S. Cl. .............................. 363/21.15; 363/56.01; 363/97

(58) Field of Classification Search ............. 363/21.12, 363/21.15, 21.17, 56.01, 56.09, 56.1, 97
See application file for complete search history.

(56) References Cited

U.S. PATENT DOCUMENTS 5,793,621 A * 8/1998 Yamada ....................... 315/411
6,788,556 B2 * 9/2004 Hosotani et al. ........... 363/21.15
6,909,616 B2 * 6/2005 Kim ............................ 363/16
6,914,789 B2 * 7/2005 Kinoshita et al. ......... 363/21.12
2003/0095420 A1 * 5/2003 Imamura .................. 363/21.12
2003/0099119 A1 * 5/2003 Yamada et al. ............ 363/21.12
2006/0181905 A1 * 8/2006 Summer .................... 363/21.12

FOREIGN PATENT DOCUMENTS

JP    3022246    1/2000

OTHER PUBLICATIONS

U.S. Appl. No. 11/549,850, filed Oct. 16, 2006, Nakamura.

* cited by examiner

*Primary Examiner*—Bao Q. Vu
(74) *Attorney, Agent, or Firm*—Oblon, Spivak, McClelland, Maier & Neustadt, P.C.

(57) ABSTRACT

A switching power source apparatus has a switching element Q1. Between terminals of the switching element Q1, there is parasitic capacitance (C1, C2). A voltage V4 of parasitic oscillation appears at a gate of the switching element Q1 after a flyback period. A voltage detector detects a drop in the voltage V4 and outputs a detection signal V6. The detection signal V6 is delayed by a timer, which outputs an ON start signal synchronized with timing T at which the voltage V4 reaches a bottom level. In response to the ON start signal from the timer, a controller outputs an ON control signal to turn on the switching element Q1. In response to the ON control signal from the controller, a driver applies a drive signal to the gate of the switching element Q1, thereby driving the switching element Q1.

5 Claims, 10 Drawing Sheets

SWITCHING POWER SOURCE APPARATUS WITH VOLTAGE GATE DETECTOR FOR THE SWITCH

BACKGROUND OF THE INVENTION

1. Field of the Invention

The present invention relates to a switching power source apparatus based on a quasi-resonance control method, capable of reducing package size and cost.

2. Description of the Related Art

The quasi-resonance control method is one of methods for controlling a switching power source apparatus having a switching element. During an OFF period of the switching element, a voltage of free oscillation due to parasitic oscillation at a drain of the switching element drops. When the voltage drop reaches a bottom level, the quasi-resonance control method detects it and turns on the switching element. This method can reduce a switching loss and noise. The method is disclosed in, for example, Japanese Patent Publication No. 3022246.

A switching power source apparatus proposed in the above-mentioned patent publication has a primary circuit connected to a primary winding of a transformer, a secondary circuit connected to a secondary winding of the transformer, and a controller connected to a tertiary winding of the transformer. The controller detects a bottom voltage of parasitic oscillation after a flyback period and controls a switching element accordingly.

SUMMARY OF THE INVENTION

A switching power source apparatus employing the quasi-resonance control method is generally manufactured by integrating a part of the apparatus into a semiconductor integrated circuit and by fabricating the apparatus into a small-size package, to improve mass productivity.

The switching power source apparatus according to the related art should design and prepare dedicated terminals on a semiconductor integrated circuit on which the primary circuit and controller are integrated, to directly connect the semiconductor integrated circuit to the tertiary winding of the transformer. This configuration makes it difficult to fabricate the switching power source apparatus into a small-size package. To detect a voltage generated on the tertiary winding of the transformer, the tertiary winding must be connected to rectification elements such as diodes. This increases the cost of the switching power source apparatus. There is a need, therefore, for a circuit configuration applicable for a switching power source apparatus, capable of achieving the quasi-resonance control method to reduce a switching loss and noise without forming dedicated terminals on a semiconductor integrated circuit for connecting the semiconductor integrated circuit to a tertiary winding of a transformer.

According to the present invention, a switching power source apparatus capable of reducing package size and cost, realizing the quasi-resonance control method to reduce a switching loss and noise, and simplifying the structure of the apparatus can be provided.

In order to accomplish the object, a first aspect of the present invention provides a switching power source apparatus having a switching element connected in series with a DC power source through a primary winding of a transformer, a voltage detector configured to detect a voltage change occurring at a gate of the switching element and output a detection signal, the voltage change occurring after a flyback period due to free oscillation caused by parasitic capacitance and/or optionally added capacitance between terminals of the switching element, a controller configured to output an ON control signal to turn on the switching element according to the detection signal from the voltage detector, and a driver configured to apply, according to the ON control signal from the controller, a drive signal to the gate of the switching element, to drive the switching element.

According to a second aspect based on the first aspect of the present invention, the voltage detector outputs the detection signal when detecting that the voltage change due to free oscillation after a flyback period has nearly reached a bottom level.

According to a third aspect based on the first aspect of the present invention, the switching power source apparatus further has a timer configured to delay the detection signal from the voltage detector by a predetermined delay time and output an ON start signal synchronized with the timing when the voltage change due to free oscillation after a flyback period nearly reaches a bottom level. The voltage detector outputs the detection signal when detecting that free oscillation after a flyback period has started. The controller outputs, in response to the ON start signal from the timer, the ON control signal to turn on the switching element.

According to a fourth aspect based on the first aspect of the present invention, the switching power source apparatus further has an impedance adjuster connected between the driver and the switching element, configured to increase impedance and thereby increase an amplitude voltage of free oscillation which occurs at the gate of the switching element after a flyback period during an OFF period of the switching element.

According to a fifth aspect based on the first aspect of the present invention, the driver includes a first drive element configured to output a high-level voltage to the gate of the switching element in response to the ON control signal from the controller, a second drive element configured to output a ground-level voltage, and an OFF command circuit configured to prevent an erroneous operation of the switching element. The OFF command circuit temporarily turns off the second drive element after the switching element is turned off from an ON state, to increase impedance between the gate of the switching element and the ground. At the same time, the OFF command circuit clamps, directly or indirectly through the second drive element, an amplitude voltage of free oscillation occurring at the gate of the switching element so that the amplitude voltage of free oscillation may not exceed a predetermined level.

DESCRIPTION OF THE PREFERRED EMBODIMENT

Figure 1:
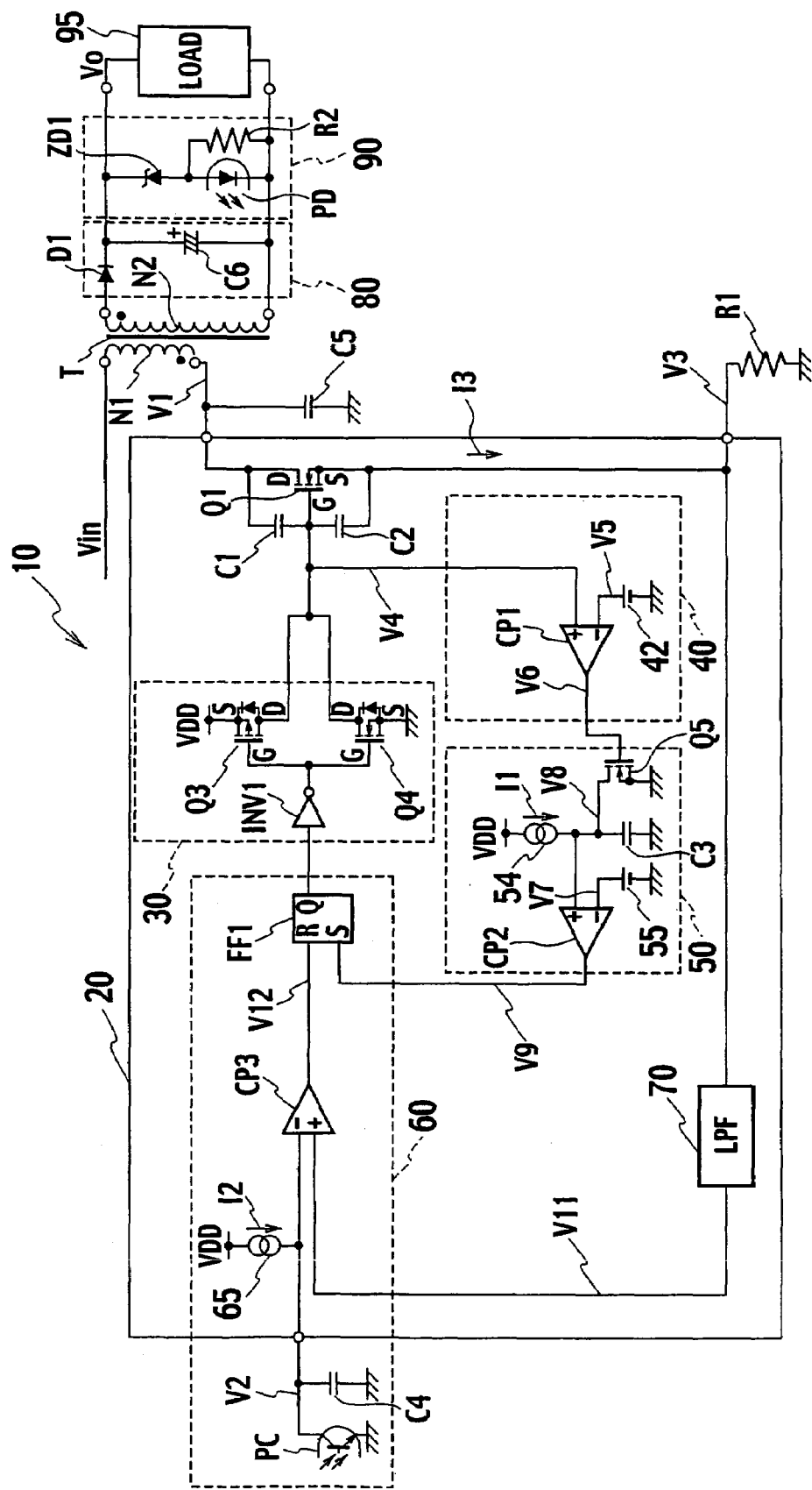
FIG. 1 is a view showing a switching power source apparatus 10 according to an embodiment of the present invention.

A switching power source apparatus according to an embodiment of the present invention will be explained with reference to the drawings. In FIG. 1, the switching power source apparatus 10 according to an embodiment of the present invention has a primary circuit connected to a primary winding N1 of a transformer T and a secondary circuit connected to a secondary winding N2 of the transformer T. Main elements of the primary circuit are arranged in a semiconductor integrated circuit 20. The transformer T transfers electric energy of the primary circuit to the secondary circuit through the windings N1 and N2.

In the primary circuit, a DC voltage Vin is provided at a first terminal of the primary winding N1 of the transformer T. A second terminal of the primary winding N1 is connected in series with a drain of a switching element Q1 which is an n-type MOSFET to drive the primary winding N1. A connection point between the primary winding N1 of the transformer T and the drain of the switching element Q1 is grounded through a capacitor C5. The capacitance of the capacitor C5 includes parasitic capacitance existing between the drain of the switching element Q1 and the ground and the stray capacitance of, for example, substrate patterns.

The switching element Q1 has parasitic capacitance C1 between the gate and drain thereof and parasitic capacitance C2 between the gate and source thereof. The gate, drain, and source terminals of the switching element Q1 are capacitively coupled on a semiconductor substrate. The gate of the switching element Q1 is commonly connected to a drain of a p-type MOSFET Q3 and a drain of an n-type MOSFET Q4. The MOSFETs Q3 and Q4 are contained in a driver 30. Also, the gate of the switching element Q1 is connected to a positive input terminal of a comparator CP1 of a voltage detector 40. When the switching element Q1 is OFF, the drain thereof generates a parasitic oscillation (free oscillation) voltage which is divided by the parasitic capacitances C1 and C2 into an AC signal V4. The AC signal V4 is supplied to the positive input terminal of the comparator CP1. If the AC signal V4 is lower than a reference voltage V5 supplied to a negative input terminal of the comparator CP1, an output terminal of the comparator CP1 outputs a low-level signal to a timer 50.

In the timer 50, the detection signal V6 from the voltage detector 40 is supplied to a gate of an n-type MOSFET Q5. When the detection signal V6 changes from high to low, a constant current I1 from a constant current source 54 passes through a capacitor C3, to charge the capacitor C3. When a charge voltage V8 of the capacitor C3 exceeds a reference voltage V7, a comparator CP2 outputs a high-level set signal V9.

A controller 60 has a photocoupler PC which is optically connected to a photodiode PD arranged on the secondary side. Between a collector and an emitter of the photocoupler PC, a capacitor C4 is connected in parallel. A constant current source 65 supplies a constant current I2 to ON-resistance between the collector and emitter of the photocoupler PC in ON state and the capacitor C4. A terminal voltage of the capacitor C4 is supplied to a comparator CP3. The ON-resistance between the collector and emitter of the photocoupler PC is variable depending on an error voltage to be explained later. The constant current I2 passing through the ON-resistance and capacitor C4 generates a feedback voltage V2 which is supplied to a negative input terminal of the comparator CP3.

A saw-toothed wave current I3 passing through the switching element Q1 is converted by a detection resistor R1 into a voltage which is shaped by a low-pass filter 70 into a voltage signal V11. The voltage signal V11 is supplied to a positive input terminal of the comparator CP3. If the saw-toothed voltage signal V11 is greater than the feedback voltage V2, the comparator CP3 outputs a high-level pulse signal (reset signal).

An output terminal of the comparator CP3 is connected to a reset terminal of an SR flip-flop FF1. An output terminal of the SR flip-flop FF1 is connected to an input terminal of an inverter INV1. An output terminal of the inverter INV1 is commonly connected to gates of the p-type MOSFET Q3 and n-type MOSFET Q4. The inverter INV1 and MOSFETs Q3 and Q4 form the driver 30 to turn on and off the switching element Q1.

On the secondary side, the secondary winding N2 of the transformer T is connected to an anode of a diode D1. A cathode of the diode D1 is connected to a first end of a capacitor C6. The diode D1 and capacitor C6 form a rectifier-smoother 80 to rectify and smooth a pulse voltage generated by the secondary winding N2 of the transformer T. An output of the rectifier-smoother 80 is connected to an output voltage detector 90 and a load 95. The output voltage detector 90 includes a resistor R2 and a Zener diode ZD1 that are connected in series. The resistor R2 is connected in parallel with the photodiode PD. If a voltage applied to a cathode of the Zener diode ZD1 exceeds a Zener voltage, an error voltage is applied to an anode of the photodiode PD. Then, the photodiode PD outputs an optical signal representative of the error voltage to the photocoupler PC that is optically connected to the photodiode PD.

Figure 2:
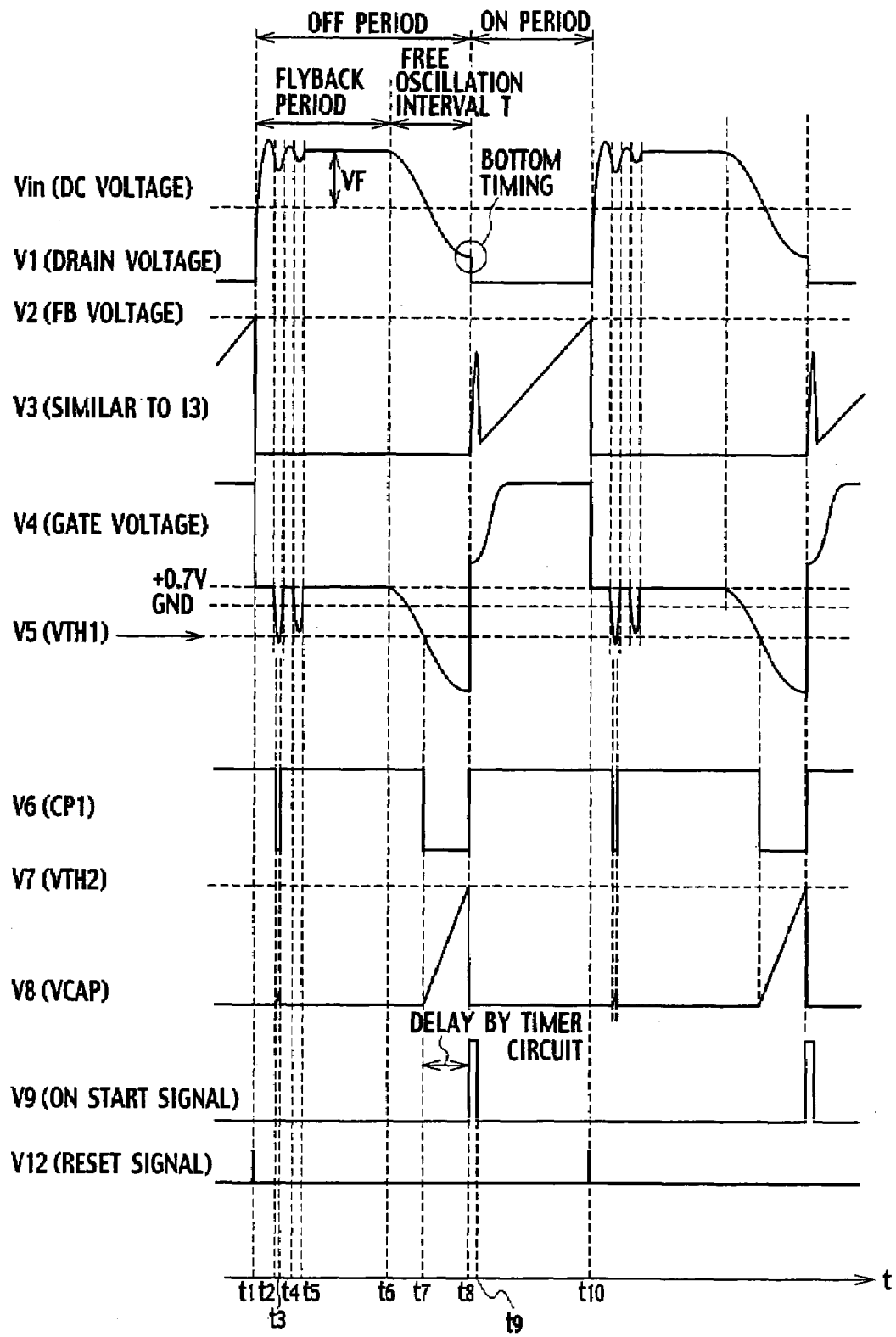
FIG. 2 is a timing chart showing operation of the switching power source apparatus 10.

Operation of the switching power source apparatus of FIG. 1 will be explained with reference to the timing chart of FIG. 2.

First, operation of turning on the switching element Q1 from an OFF state will be explained. Between t1 and t8, the switching element Q1 is OFF.

During an on period (t8 to t10), the transformer T accumulates magnetic energy. The magnetic energy is discharged with in a flyback period (t1 to t6). In the flyback period, the drain of the switching element Q1 generates a drain voltage V1 which is the sum of a DC voltage Vin and a flyback voltage VF. The flyback voltage VF is substantially expressed by a relationship of $VF=Vo(N1/N2)$, where Vo is an output voltage, N1 is the number of turns of the primary winding N1 of the transformer T, and N2 is the number of turns of the secondary winding N2 of the transformer T.

After the flyback period (t1 to t6), the drain of the switching element Q1 shows a free oscillation waveform, i.e., a parasitic oscillation voltage around the DC voltage Vin due to an inductance component on the primary side of the transformer T and the capacitance of the capacitor C5 including stray capacitance.

An AC component of the free oscillation is divided by the parasitic capacitances C1 and C2 existing between the terminals and gate of the switching element Q1 into a voltage signal V4 which is supplied to the positive input terminal of the comparator CP1 of the voltage detector 40.

The negative input terminal of the comparator CP1 of the voltage detector 40 receives a negative reference voltage V5 (for example, −1 V). When the voltage signal V4 supplied to the positive input terminal becomes lower than the reference voltage V5 (at t7), the output voltage V6 of the comparator CP1 changes from high to low.

The output voltage V6 from the comparator CP1 of the voltage detector 40 is supplied to the gate of the switching element Q5, which is an n-type MOSFET, of the timer 50. When the output voltage V6 changes from high to low (at t7), the capacitor C3 is charged by the constant current I1 supplied from the constant current source 54. The terminal voltage VB of the capacitor C3 gradually increases from 0 V (at t7), and when it exceeds the reference voltage V7 (at t8), the comparator CP2 outputs an output voltage V9 as a high-level pulse signal during a period from t8 to t9. This high-level pulse signal is an ON start signal supplied to the set terminal of the SR flip-flop FF1 of the controller 60. In response to the ON start signal, an output signal from the SR flip-flop FF1 changes from low level to high level and is supplied to the inverter INV1 of the driver 30. Then, the output of the inverter INV1 changes from high to low. At this time (t8), the drive element Q3 having a p-type MOSFET becomes conductive (operative) and the drive element Q4 made of ann-type MOSFET becomes nonconductive (inoperative). As a result, a high-level signal is supplied to the gate of the switching element Q1, to turn on the switching element Q1 from the OFF state.

If a period of the free oscillation voltage of the drain of the switching element Q1 is shorter than a time constant determined by the timer 50 expressed by C3(V7/I1), the output voltage V9 of the comparator CP2 does not change to high. This prevents an erroneous detection of a ringing waveform having a short period occurring at the drain of the switching element Q1 just after the switching element Q1 is turned off (in a period from t2 to t5).

Operation of turning off the switching element Q1 from the ON state will be explained. The feedback voltage V2 is supplied to the negative input terminal of the comparator CP3. The saw-toothed drain current I3 is converted by the resistor R1 into a voltage waveform V3 which is passed through the low-pass filter 70 to provide the voltage waveform V11. The voltage waveform V11 is supplied to the positive input terminal of the comparator CP3. If the voltage waveform V11 is larger than the feedback voltage V2, the reset input voltage V12 supplied from the comparator CP3 to the reset terminal of the SR flip-flop FF1 changes from low to high. In response to the reset input voltage V12, the SR flip-flop FF1 changes its output from high level to low level. The low-level output from the SR flip-flop FF1 is supplied to the inverter INV1 of the driver 30, and the inverter INV1 changes its output from low to high. At this time (t10), the drive element Q3 having a p-type MOSFET becomes nonconductive (inoperative) and the drive element Q4 made of an n-type MOSFET becomes conductive (operative). As a result, a low-level signal is supplied to the gate of the switching element Q1, to turn off the switching element Q1 from the ON state.

In this way, according to this embodiment, the parasitic capacitances C1 and C2 existing between the terminals of the switching element Q1 cause parasitic oscillation at the gate of the switching element Q1 after a flyback period. When the voltage V4 due to the parasitic oscillation drops to a predetermined level, the voltage detector 40 arranged in the semiconductor integrated circuit 20 detects the voltage drop and outputs the detection signal V6. The timer 50 delays the detection signal V6 and outputs the ON start signal which is nearly synchronized with the timing T at which the parasitic oscillation reaches a bottom voltage. In response to the ON start signal from the timer 50, the controller 60 outputs the ON control signal to turn on the switching element Q1. In response to the ON control signal from the controller 60, the driver 30 applies a drive signal to the gate of the switching element Q1, to drive the switching element Q1. With this configuration, the switching power source apparatus can efficiently achieve the quasi-resonance control method to reduce a switching loss and noise without additional external parts such as bottom detection terminals and diodes. Accordingly, the switching power source apparatus of this configuration can reduce package size and cost.

The circuit arrangement of this embodiment is simple to realize the quasi-resonance control method capable of reducing a switching loss and noise. Unlike the related art, the embodiment needs no dedicated connection terminals for a tertiary winding on the semiconductor integrated circuit 20, and therefore, can reduce package size.

According to the present invention, parasitic capacitance and/or optionally added capacitance between the terminals of a switching element generates a voltage at the gate of the switching element based on parasitic oscillation occurring after a flyback period. When the voltage generated at the gate of the switching element drops to a bottom level, the voltage drop is detected to output a detection signal. In response to the detection signal, an ON control signal is outputted to turn on the switching element. In response to the ON control signal, a drive signal is applied to the gate of the switching element, to thereby drive the switching element. This configuration can effectively realize the quasi-resonance control method capable of reducing a switching loss and noise and simplify the structure of the switching power source apparatus. Unlike the related art, the present invention needs no dedicated connection terminals for a tertiary winding on a semiconductor integrated circuit, and therefore, can reduce package size.

According to the present invention, parasitic capacitance and/or optionally added capacitance between the terminals of a switching element causes parasitic oscillation at the gate of the switching element after a flyback period. The start of the parasitic oscillation is detected to output a detection signal. The detection signal is delayed by a predetermined delay time, to output an ON start signal synchronized with the timing at which the parasitic oscillation reaches a bottom voltage. In response to the ON start signal, an ON control signal is outputted to turn on the switching element. In response to the ON control signal, a drive signal is applied to the gate of the switching element, to thereby drive the switching element. This configuration can realize the quasi-resonance control method capable of reducing a switching loss and noise and simplify the structure of the switching power source apparatus. Unlike the related art, the present invention needs no dedicated connection terminals for a tertiary winding on a semiconductor integrated circuit, and therefore, can reduce package size.

First Modification

Figure 3:
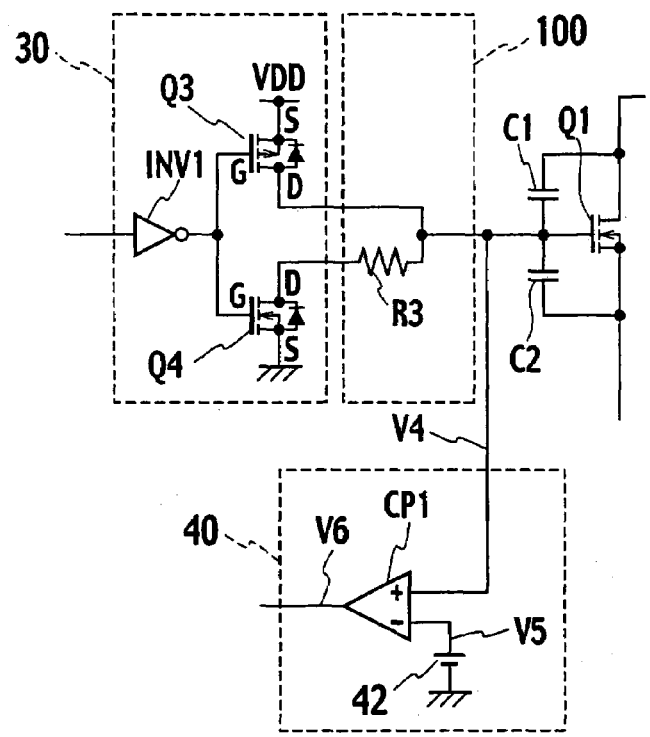
FIG. 3 is a view showing a characteristic part of a first modification of the switching power source apparatus of FIG. 1.

FIG. 3 shows a characteristic part of the first modification of the switching power source apparatus shown in FIG. 1.

The first modification additionally arranges an impedance adjuster 100 between the driver 30. and the switching element Q1 of the configuration of FIG. 1. The impedance adjuster 100 provides a high impedance during an OFF period of the switching element Q1, to increase an amplitude voltage of parasitic oscillation occurring at the gate of the switching element Q1 after a flyback period.

In the configuration with the impedance adjuster 100, the drain of the drive element Q3 made of a p-type MOSFET is directly connected to the gate of the switching element Q1, the drain of the drive element Q4 made of an n-type MOSFET is connected through a resistor R3 to the gate of the switching element Q1, and the gate of the switching element Q1 is connected to the positive input terminal of the comparator CP1.

Operation of the impedance adjuster 100 will be explained with reference to the timing chart of FIG. 2. At time t8 of FIG. 2, the set terminal of the SR flip-flop FF1 receives an ON start signal, and the output terminal of the SR flip-flop FF1 changes to high. As a result, the output of the inverter INV1 changes from high level to low level.

At this time, the drive element Q3 becomes conductive, the drive element Q4 made of an n-type MOSFET becomes nonconductive, the gate of the switching element Q1 receives a high-level signal, and the switching element Q1 turns on from an OFF state. During a period from t1 to t8 of FIG. 2, the inverter INV1 provides a high-level output. At this time, the drive element Q3 is nonconductive and the drive element Q4 made of an n-type MOSFET is conductive. Namely, the drain and source of the drive element Q4 are grounded, and the gate voltage V4 of the switching element Q1 is grounded through the resistor R3. As a result, an amplitude voltage of parasitic oscillation occurring at the gate of the switching element Q1 in a period from t6 to t8 after a flyback period becomes larger than that occurring without the resistor R3.

According to the first modification, a high-impedance element, i.e., the resistor R3 between the driver 30 and the switching element Q1, is added to increase an amplitude of parasitic oscillation occurring at the gate of the switching element Q1 after a flyback period during an OFF period of the switching element Q1. This configuration is advantageous in easily detecting the start timing of the parasitic oscillation after a flyback period.

Second Modification

Figure 4:
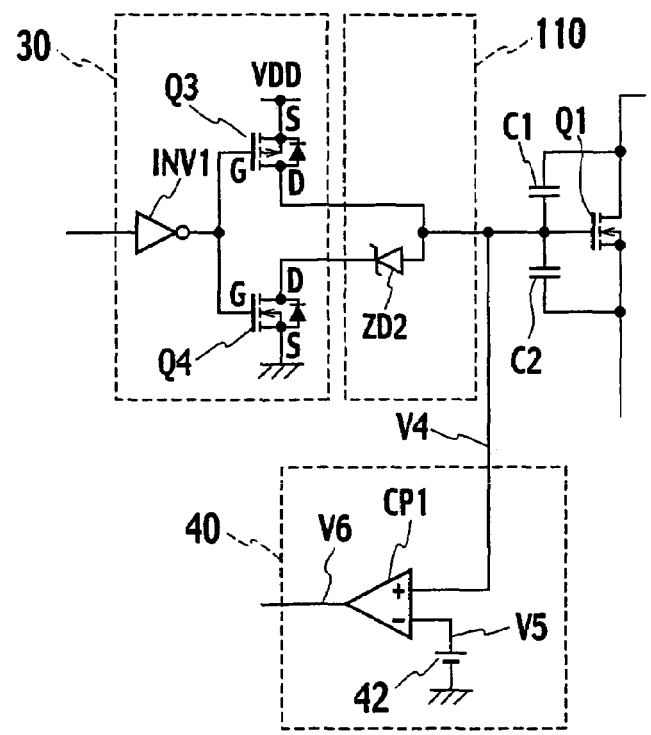
FIG. 4 is a view showing a characteristic part of a second modification of the switching power source apparatus of FIG. 1.

FIG. 4 shows a characteristic part of the second modification of the switching power source apparatus shown in FIG. 1.

The second modification additionally arranges an impedance adjuster 110 between the driver 30 and the switching element Q1 of the configuration of FIG. 1. The impedance adjuster 110 selectively provides a high impedance during an OFF period of the switching element Q1 to increase an amplitude voltage of parasitic oscillation occurring at the gate of the switching element Q1 after a flyback period.

In the configuration with the impedance adjuster 110, the drain of the drive element Q3 made of a p-type MOSFET is directly connected to the gate of the switching element Q1, the drain of the drive element Q4 made of an n-type MOSFET is connected to a cathode of a Zener diode ZD2, an anode of the Zener diode ZD2 is connected to the gate of the switching element Q1, and the gate of the switching element Q1 is connected to the positive input terminal of the comparator CP1.

Operation of the impedance adjuster 110 will be explained with reference to the timing chart of FIG. 5.

Figure 5:
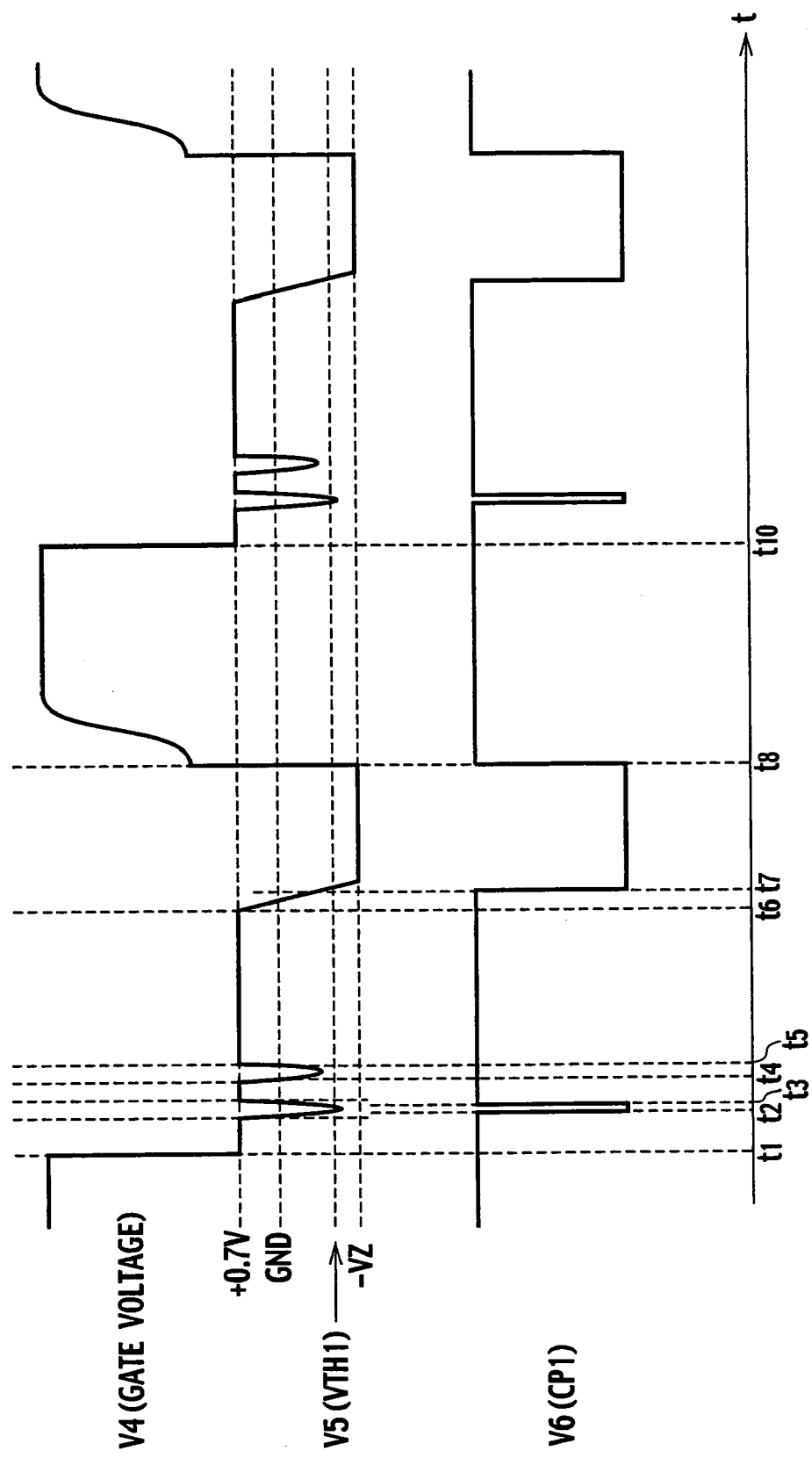
FIG. 5 is a timing chart showing operation of the second modification.

At time t8 of FIG. 5, the set terminal of the SR flip-flop FF1 receives an ON start signal, and the output of the inverter INV1 changes from high level to low level.

At this time, the drive element Q3 becomes conductive, the drive element Q4 made of an n-type MOSFET becomes nonconductive, the gate of the switching element Q1 receives a high-level signal, and the switching element Q1 turns on from an OFF state.

During a period from t1 to t8 of FIG. 5, the inverter INV1 provides a high-level output.

At this time, the drive element Q3 is nonconductive and the drive element Q4 having an n-type MOSFET is conductive. Namely, the drain and source of the drive element Q4 are grounded, and the gate voltage V4 of the switching element Q1 is grounded through the Zener diode ZD2.

At this time, the impedance of the Zener diode ZD2 is large until the gate voltage V4 reaches the Zener voltage (−Vz) of the Zener diode ZD2 and becomes small when the gate voltage V4 reaches the Zener voltage. Then, the gate voltage V4 is clamped by the Zener diode ZD2 at the Zener voltage, to have a rectangular waveform. As a result, an amplitude voltage of parasitic oscillation occurring at the gate of the switching element Q1 in a period from t6 to t8 after a flyback period becomes larger than that without the Zener diode ZD2.

In this way, the second modification inserts According to the second modification, the Zener diode ZD2 which selectively realizes a high impedance, is added between the driver 30 and the switching element Q1, to increase an amplitude of negative voltage of parasitic oscillation occurring at the gate of the switching element Q1 after a flyback period during an OFF period of the switching element Q1. This configuration is advantageous in easily detecting the start timing of the parasitic oscillation after a flyback period.

Third Modification

Figure 6:
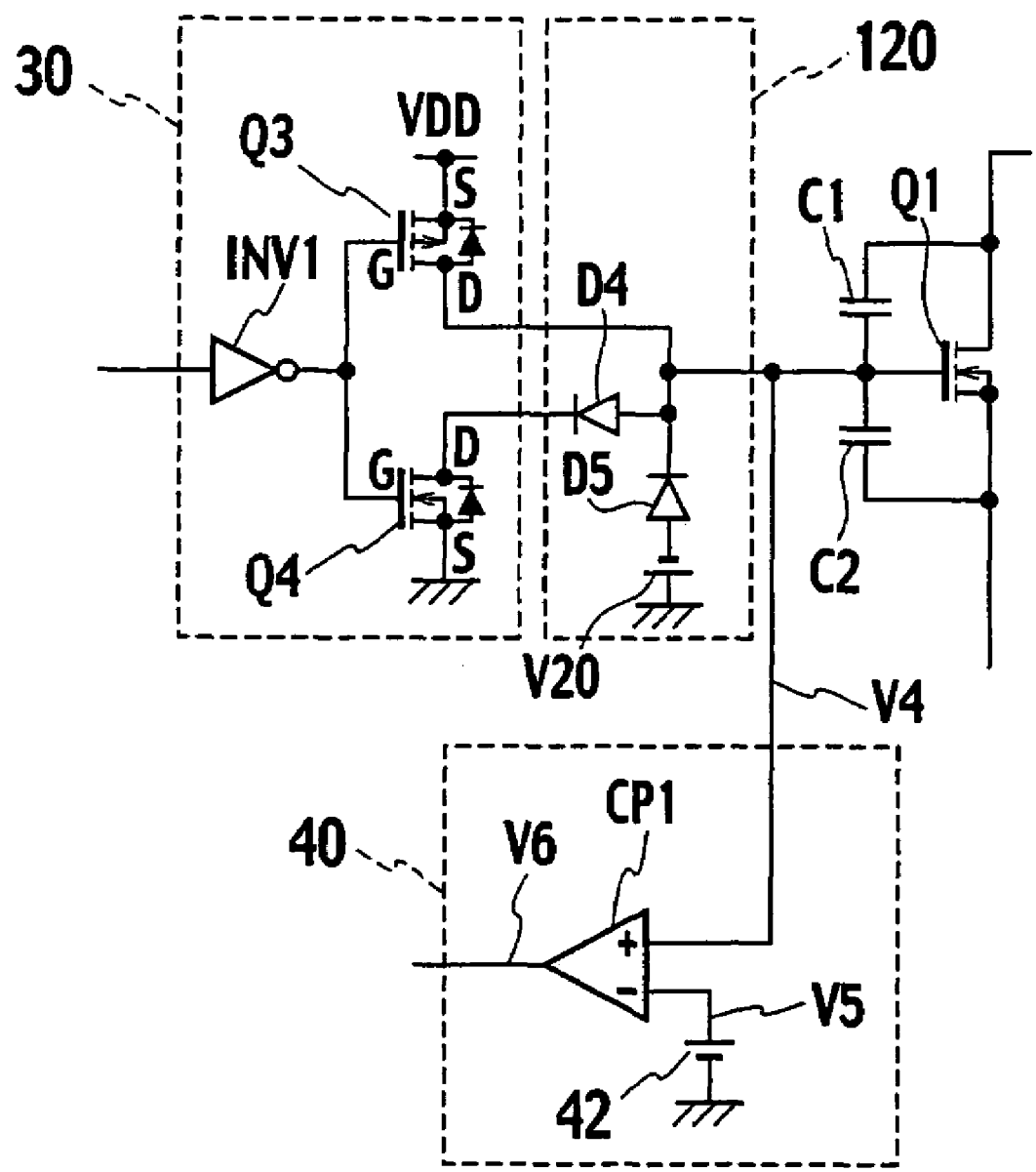
FIG. 6 is a view showing a characteristic part of a third modification of the switching power source apparatus of FIG. 1.

FIG. 6 shows a characteristic part of the third modification of the switching power source apparatus shown in FIG. 1.

The third modification additionally arranges an impedance adjuster 120 between the driver 30 and the switching element Q1 of the configuration of FIG. 1. The impedance adjuster 120 selectively provides a high impedance during an OFF period of the switching element Q1, to increase an amplitude voltage of parasitic oscillation occurring at the gate of the switching element Q1 after a flyback period.

In the configuration with the impedance adjuster 120, the drain of the drive element Q3 made of a p-type MOSFET is directly connected to the gate of the switching element Q1, the drain of the drive element Q4 made of an n-type MOSFET is connected to a cathode of a diode D4, an anode of the diode D4 is connected to the gate of the switching element Q1, the gate of the switching element Q1 is connected to a cathode of a diode D5, an anode of the diode D5 is connected to a negative reference power source V20, and the gate of the switching element Q1 is connected to the positive input terminal of the comparator CP1.

Figure 7:
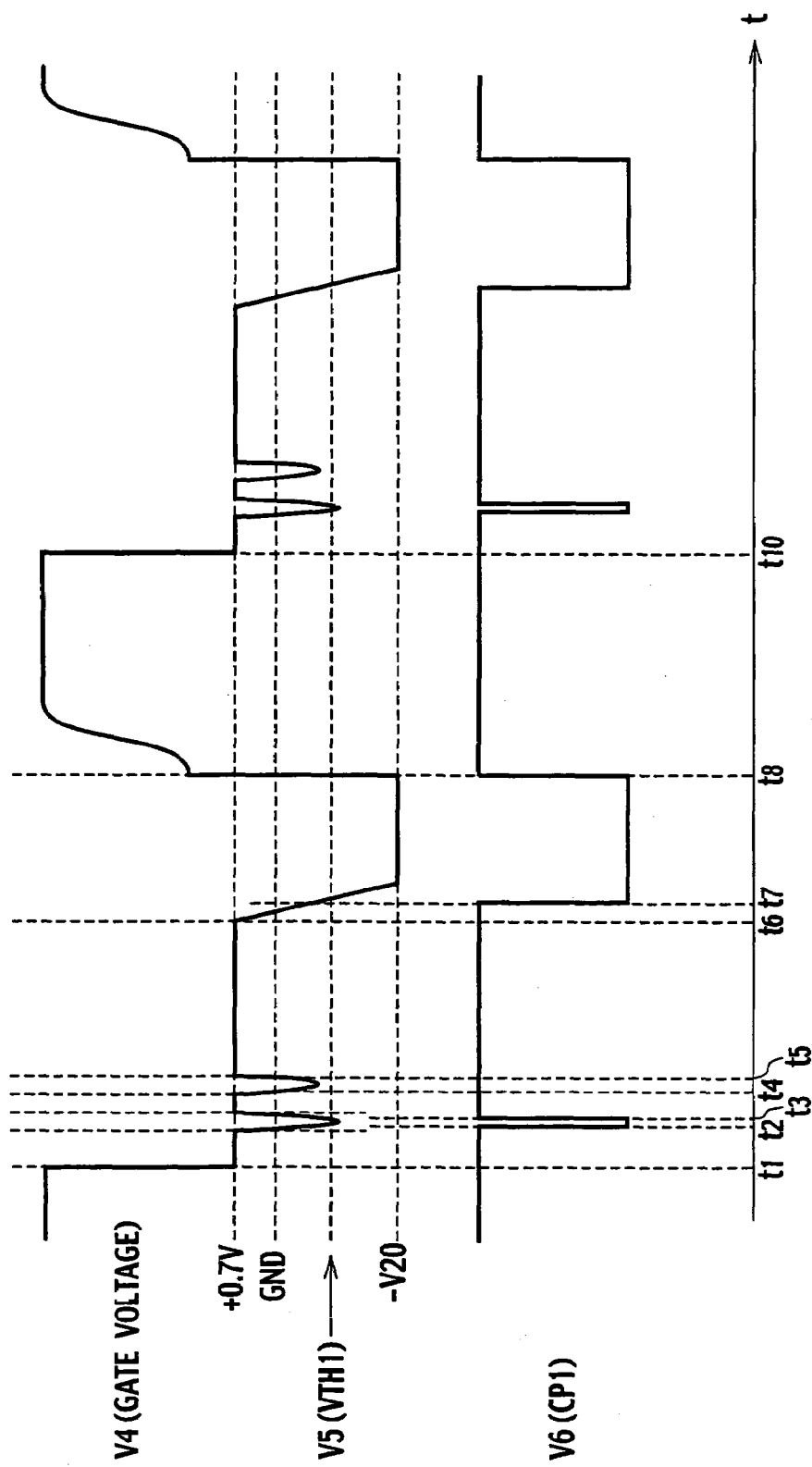
FIG. 7 is a timing chart showing operation of the third modification.

Operation of the impedance adjuster 120 will be explained with reference to the timing chart of FIG. 7. At time t8 of FIG. 7, the set terminal of the SR flip-flop FF1 receives an ON start signal, and the output of the inverter INV1 changes from high level to low level.

At this time, the drive element Q3 becomes conductive, the drive element Q4 made of an n-type MOSFET becomes nonconductive, the gate of the switching element Q1 receives a high-level signal, and the switching element Q1 turns on from an OFF state. During a period from t1 to t8 of FIG. 7, the inverter INV1 provides a high-level output. At this time, the drive element Q3 is nonconductive and the drive element Q4 made of an n-type MOSFET is conductive. Namely, the drain and source of the drive element Q4 are grounded, and the gate voltage V4 of the switching element Q1 is grounded through the diode D4. At this time, the gate voltage V4 is clamped by the diode D5 at a negative reference voltage V20 to form a rectangular waveform, as shown in FIG. 7. As a result, an amplitude voltage of parasitic oscillation occurring at the gate of the switching element Q1 in a period from t6 to t8 after a flyback period becomes larger in a negative polarity.

According to the third modification, the diode D4, which selectively realizes a high impedance, is added between the driver 30 and the switching element Q1, to further decrease a negative voltage of parasitic oscillation occurring at the gate of the switching element Q1 after a flyback period during an OFF period of the switching element Q1. In addition, the gate voltage of the switching element Q1 is clamped by the diode D5 with respect to the high impedance state. This configuration is advantageous in easily detecting the start timing of the parasitic oscillation after a flyback period.

Fourth Modification

Figure 8:
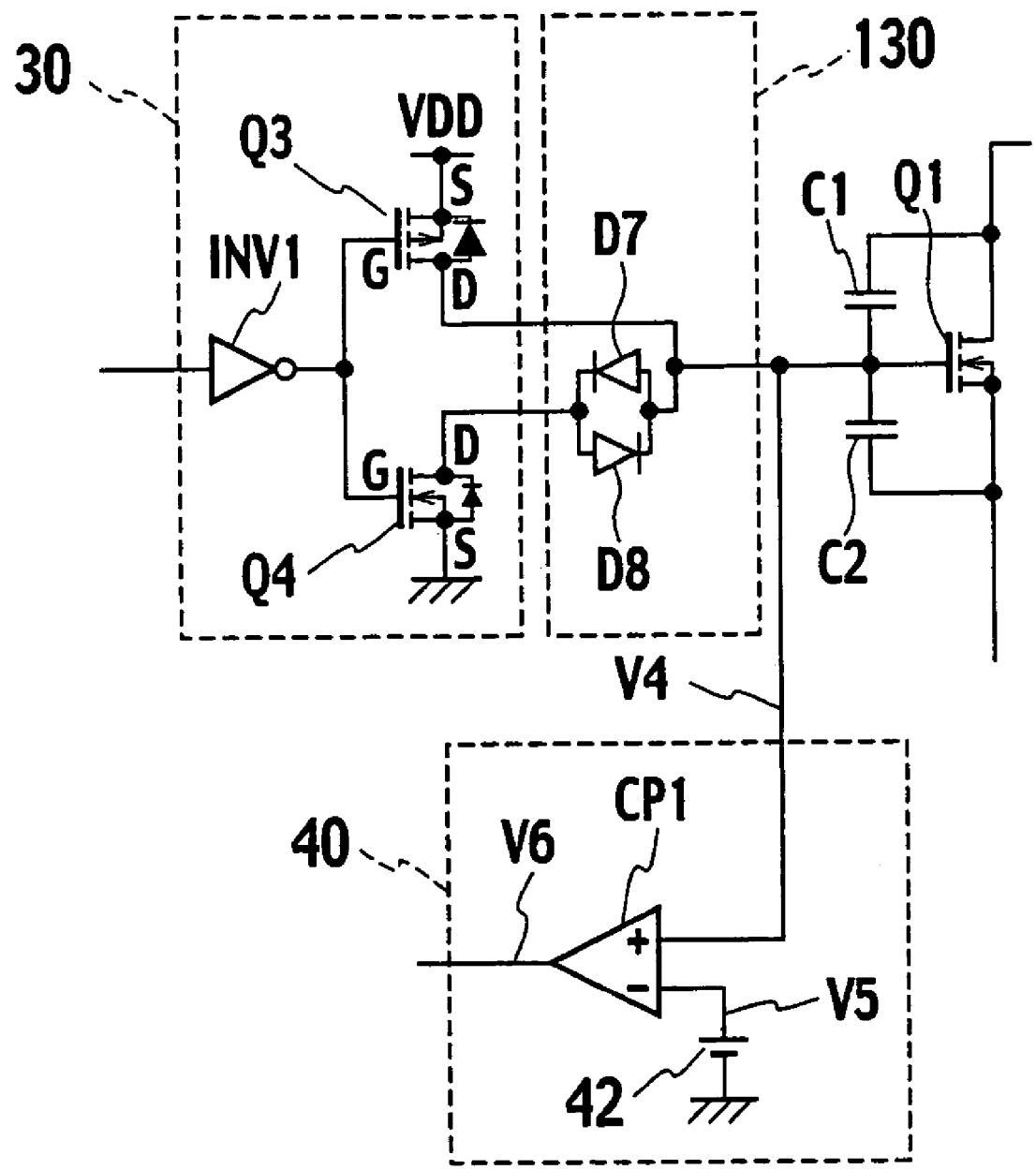
FIG. 8 is a view showing a characteristic part of a fourth modification of the switching power source apparatus of FIG. 1.

FIG. 8 shows a characteristic part of the fourth modification of the switching power source apparatus shown in FIG. 1.

The fourth modification additionally arranges an impedance adjuster 130 between the driver 30 and the switching element Q1 of the configuration of FIG. 1. According to the fourth modification, the drain of the drive element Q3 made of a p-type MOSFET is directly connected to the gate of the switching element Q1, the drain of the drive element Q4 having an n-type MOSFET is connected to a cathode of a diode D7, an anode of the diode D7 is connected to the gate of the switching element Q1, the diode D7 is connected in parallel with a diode D8 whose polarity is opposite to that of the diode D7, and the gate of the switching element Q1 is connected to the positive input terminal of the comparator CP1.

Figure 9:
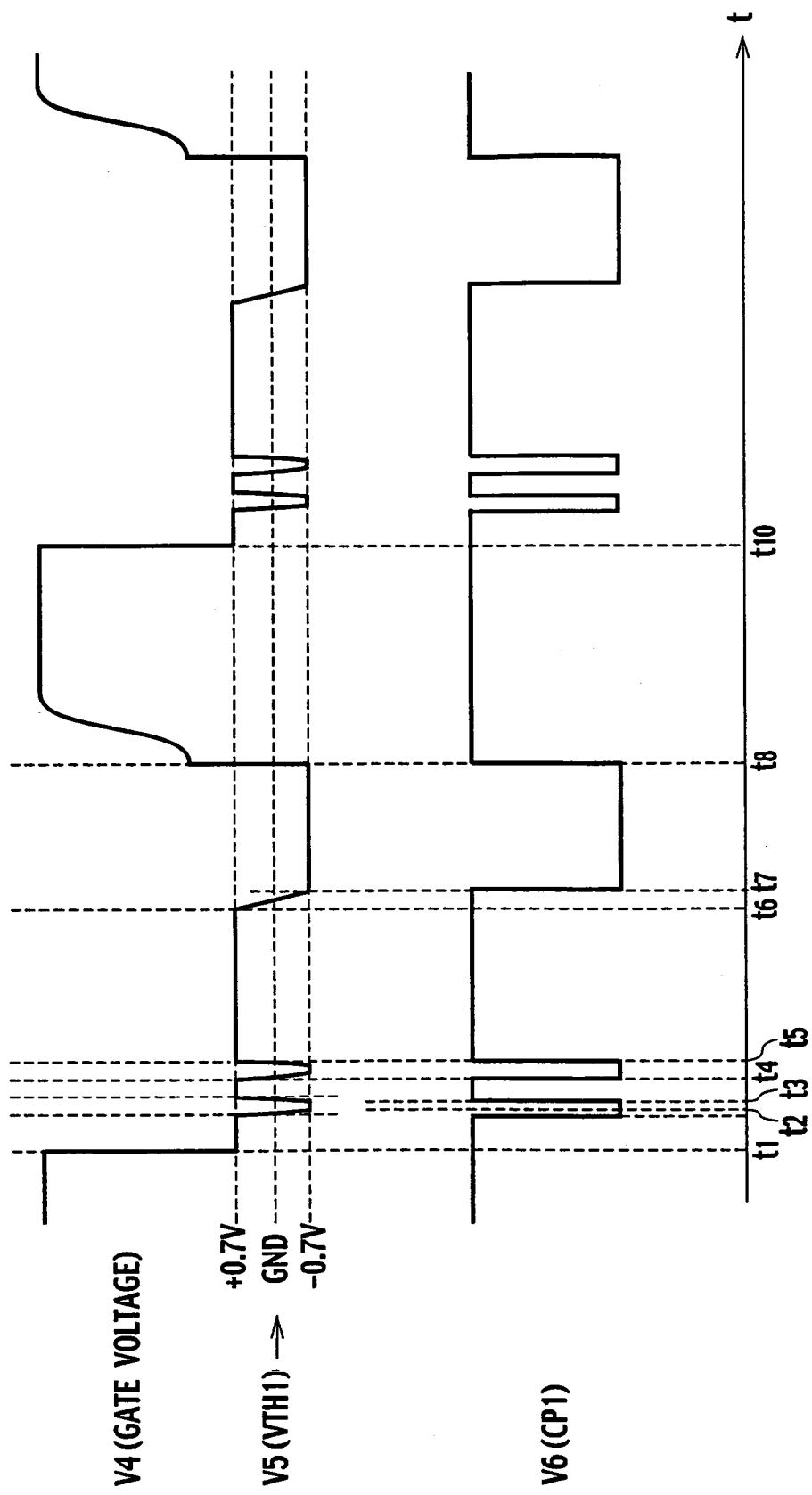
FIG. 9 is a timing chart showing operation of the fourth modification.

Operation of the impedance adjuster 130 will be explained with reference to the timing chart of FIG. 9. At time t8 of FIG. 9, the set terminal of the SR flip-flop FF1 receives an ON start signal, and the output of the inverter INV1 changes from high level to low level.

At this time, the drive element Q3 becomes conductive, the drive element Q4 made of an n-type MOSFET becomes nonconductive, the gate of the switching element Q1 receives a high-level signal, and the switching element Q1 turns on from an OFF state. During a period from t1 to t8 of FIG. 9, the inverter INV1 provides a high-level output. At this time, the drive element Q3 is nonconductive and the drive element Q4 made of an n-type MOSFET is conductive. Namely, the drain and source of the drive element Q4 are grounded, and the gate voltage V4 of the switching element Q1 is grounded through the diode D7. At this time, the gate voltage V4 is clamped by the diode D8 at a voltage of −0.7 V to form a rectangular waveform, as shown in FIG. 9. As a result, an amplitude voltage of parasitic oscillation occurring at the gate of the switching element Q1 in a period from t6 to t8 after a flyback period becomes larger than that without the diodes D7 and D8.

The reference voltage V5 of the reference power source 42 in the voltage detector 40 is, for example, 0 V.

According to the fourth modification, the diodes D7 and DB are added between the driver 30 and the switching element Q1, to realize a high impedance so that a bottom voltage of parasitic oscillation occurring at the gate of the switching element Q1 after a flyback period during an OFF period of the switching element Q1 may decrease. This configuration is advantageous in easily detecting the start timing of the parasitic oscillation after a flyback period.

Fifth Modification

Figure 10:
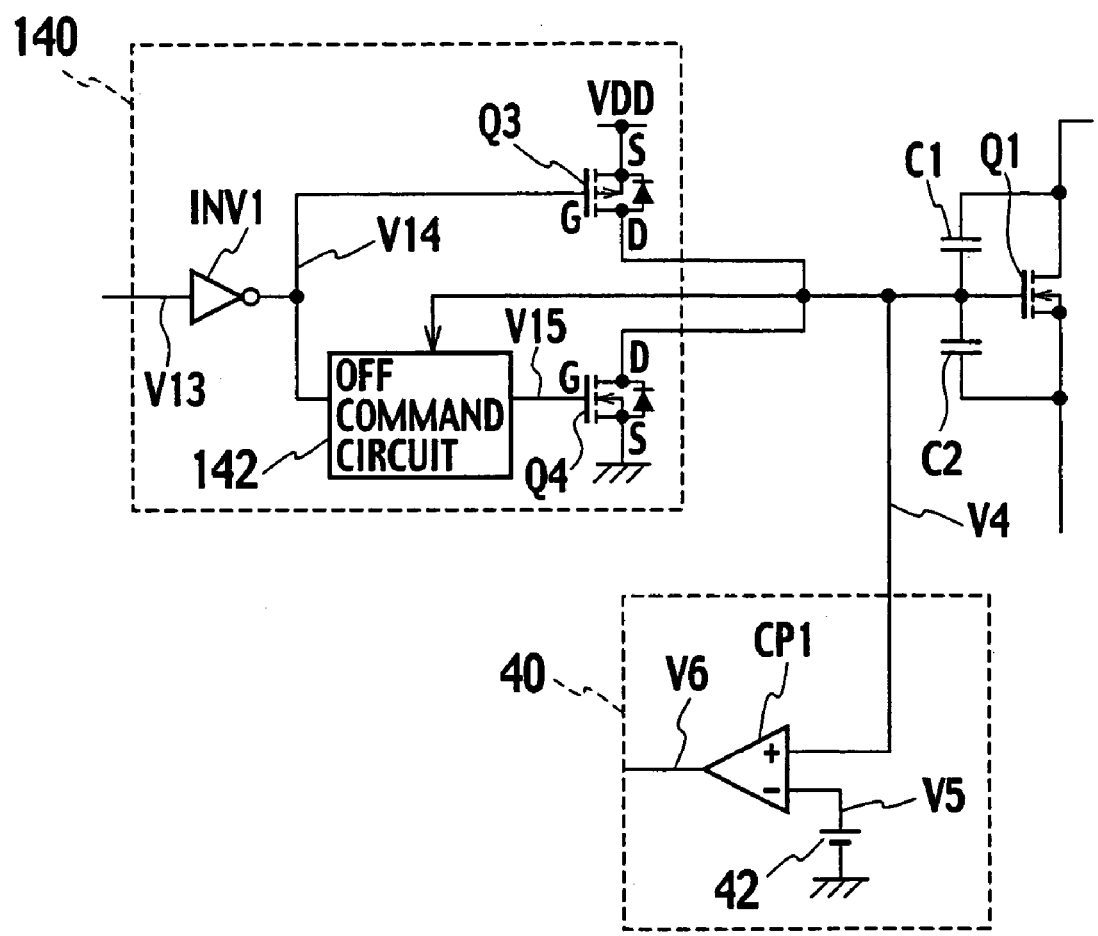
FIG. 10 is a view showing a characteristic part of a fifth modification of the switching power source apparatus of FIG. 1.

FIG. 10 shows a characteristic part of the fifth modification of the switching power source apparatus shown in FIG. 1.

The fifth embodiment employs a driver 140 instead of the driver 30 of FIG. 1. The driver 140 has an inverter INV1, drive elements Q3 and Q4, and an OFF command circuit 142.

The drive element Q3 outputs a power source voltage VDD to the gate of the switching element Q1 in response to an ON control signal provided by the controller 60.

The OFF command circuit 142 receives a voltage generated at the gate of the switching element Q1. The OFF command circuit 142 outputs an ON command signal in a flyback period if the ON control signal provided by the controller 60 is in an OFF period and if the voltage generated at the gate of the switching element Q1 is equal to or larger than an internal reference voltage Vref1 of the OFF command circuit 142. The OFF command circuit 142 outputs an OFF command signal if a voltage of parasitic oscillation drops below the reference voltage Vref1 after the flyback period.

In response to the ON command signal provided by the OFF command circuit 142, the drive element Q4 outputs a ground voltage to the gate of the switching element Q1, and in response to the OFF command signal provided by the OFF command circuit 142, realizes a high impedance.

Figure 11:
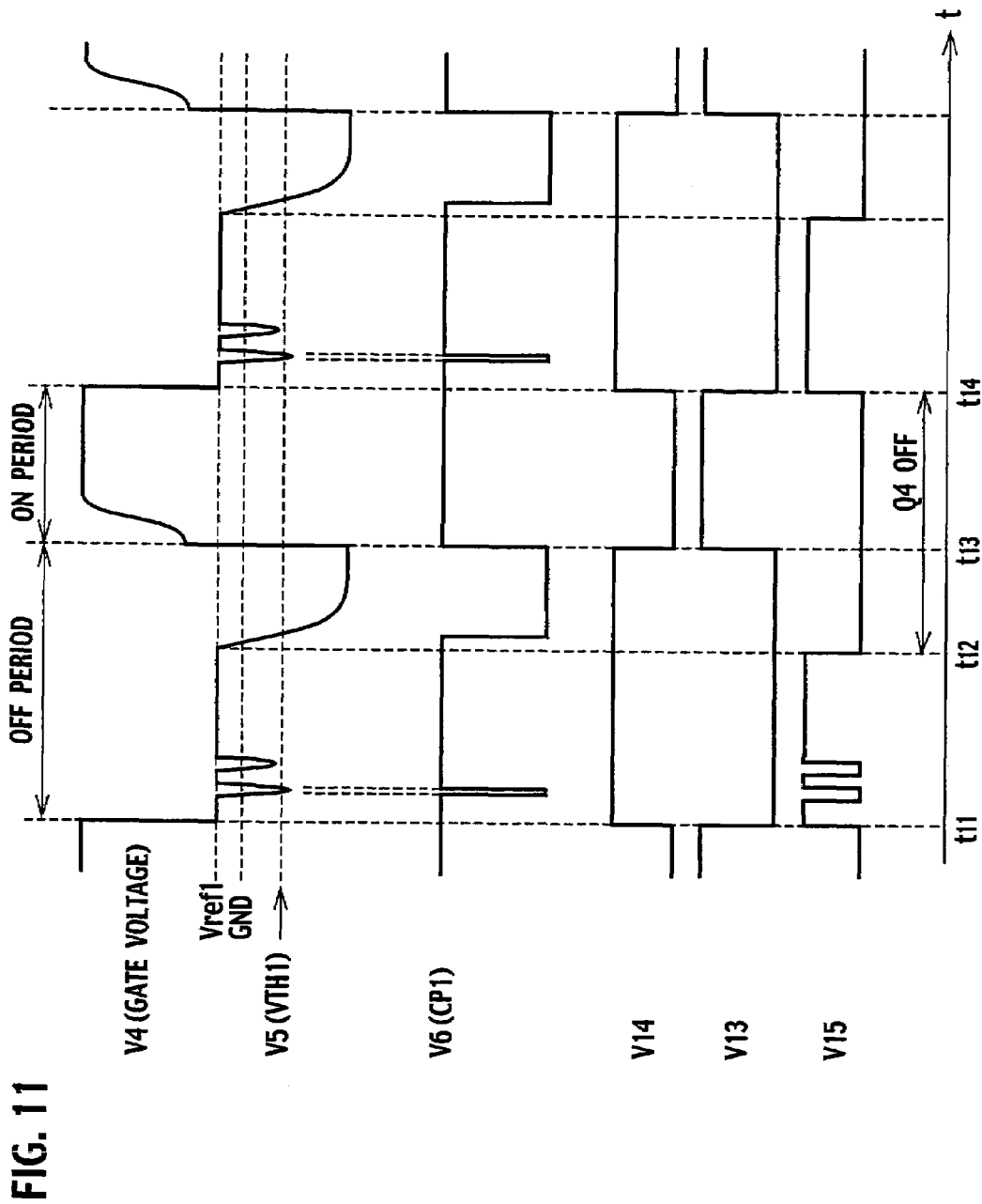
FIG. 11 is a timing chart showing operation of the fifth modification.

Operation of the drive circuit 140 will be explained with reference to the timing chart of FIG. 11. In a period from t11 to t13 of FIG. 11, the controller 60 outputs an OFF control signal (V13 of low level), and therefore, the inverter INV1 outputs a high-level output (V14). As a result, the drive element Q3 is nonconductive to turn off the switching element Q1. A period from t11 to t12 is a flyback period in which a voltage generated at the gate of the switching element Q1 is equal to or larger than the reference voltage Vref1, and the OFF command circuit 142 outputs an ON command signal to make the drive element Q4 conductive. In a period from t12 to t13, the OFF command circuit 142 detects that the voltage generated at the gate of the switching element Q1 becomes lower than the reference voltage Vref1 due to parasitic oscillation after the flyback period. Then, the OFF command circuit 142 outputs an OFF command signal to make the drive element Q4 nonconductive.

In this way, in response to an ON control signal provided by the controller 60, the power source voltage VDD is supplied from the drive element Q3 to the gate of the switching element Q1, and an OFF control signal provided by the controller 60 shows the OFF state during the OFF period. In a flyback period in which a voltage generated at the gate of the switching element Q1 is equal to or larger than the reference voltage Vref1, an ON command signal is out putted from the OFF command circuit 142. After the flyback period, as a negative voltage of parasitic oscillation drops below the reference voltage Vref1, an OFF command signal is outputted from the OFF command circuit 142.

In response to the ON command signal from the OFF command circuit 142, the drive element Q4 outputs a ground voltage to the gate of the switching element Q1. In response to the OFF command signal from the OFF command circuit 142, the drive element Q4 achieves a high impedance. The configuration of the fifth modification is advantageous in easily detecting a voltage change of parasitic oscillation after a flyback period. To avoid an excessive voltage from being applied to the gate of the switching element Q1, the OFF command circuit 142 includes a second reference voltage Vref2 and a comparator. If the gate voltage of the switching element Q1 reaches the second reference voltage Vref2, the OFF command circuit 142 turns on the drive element Q4 to protect the switching element Q1. For this purpose, it is also possible to arrange a Zener diode in parallel between the gate and drain of the switching element Q1, or it is possible to employ the clamping technique employing the diode 5 and power source 20 of the modification 3.

Other Embodiments

The present invention is not limited to the embodiment and modifications mentioned above. Other embodiments and modifications are also possible without departing from the spirit and scope of the present invention.

(1) In the embodiment of FIG. 1, the switching element Q1 is incorporated in the semiconductor integrated circuit 20. Instead, the switching element Q1 may be arranged outside the semiconductor integrated circuit 20. In this case, the switching element Q1 is provided with a gate driving terminal.

This configuration allows the switching element Q1 to be chosen according to a required output power of the switching power source apparatus, and therefore, a high-power switching power source apparatus will easily be realized. When arranging the switching element Q1 outside the semiconductor integrated circuit 20, the capacitances C1 and C2 may be internal parasitic capacitances of the switching element Q1, or external capacitors.

(2) The embodiment of FIG. 1 provides a detection signal when detecting that a gate terminal voltage of the switching element Q1 has started parasitic oscillation, delays the detection signal by the timer 90, outputs a set signal when the parasitic oscillation nearly reaches a bottom voltage, and turns on the switching element Q1. Instead, it is possible to properly set the capacitances C1 and C2 including parasitic capacitance, the impedance of the elements connected to the gate of the switching element Q1, and resistance elements, so that the comparator CP1 may provide an output signal V6 when parasitic oscillation substantially provides a bottom voltage. In this case, the timer 50 can be omitted, to simplify the structure of the switching power source apparatus.

(3) The capacitor C5 may be parasitic capacitance existing between the terminals of the switching element Q1, or may be an external capacitor arranged outside the switching element Q1.

(4) The semiconductor integrated circuit 20 may be of a monolithic type or a hybrid type. Functions realized with the semiconductor integrated circuit 20 may properly be determined without departing from the spirit of the present invention.

What is claimed is:

1. A switching power source apparatus comprising:
a switching element connected in series with a DC power source through a primary winding of a transformer;
a voltage detector configured to detect a voltage change occurring at a gate of the switching element and output a detection signal, the voltage change occurring after a flyback period due to free oscillation caused by parasitic capacitance and/or optionally added capacitance between terminals of the switching element;
a controller configured to output an ON control signal to turn on the switching element according to the detection signal from the voltage detector; and
a driver configured to apply a drive signal to the gate of the switching element to drive the switching element according to the ON control signal from the controller.

2. The switching power source apparatus of claim 1, wherein
the voltage detector outputs the detection signal when detecting the voltage due to free oscillation after a flyback period having nearly reached a bottom level.

3. The switching power source apparatus of claim 1, further comprising
a timer configured to delay the detection signal from the voltage detector by a predetermined delay time and output an ON start signal synchronized with the timing when the voltage change due to free oscillation after a flyback period nearly reaches a bottom level,
the voltage detector outputting the detection signal when detecting that free oscillation after a flyback period has started, and
the controller outputting the ON control signal to turn on the switching element in response to the ON start signal from the timer.

4. The switching power source apparatus of claim 1, further comprising
an impedance adjuster connected between the driver and the switching element, configured to increase impedance and thereby increase an amplitude voltage of free oscillation which occurs at the gate of the switching element after a flyback period during an OFF period of the switching element.

5. The switching power source apparatus of claim 1, wherein the driver comprises:
a first drive element configured to output a high-level voltage to the gate of the switching element in response to the ON control signal from the controller;
a second drive element configured to output a ground-level voltage; and
an OFF command circuit configured to prevent an erroneous operation of the switching element, the OFF command circuit temporarily turning off the second drive element after the switching element is turned off from an ON state to increase impedance between the gate of the switching element and the ground, and the OFF command circuit clamping, directly or indirectly through the second drive element, an amplitude voltage of free oscillation occurring at the gate of the switching element so that the amplitude voltage of free oscillation may not exceed a predetermined level.

* * * * *